US010325956B2

(12) United States Patent
Chou et al.

(10) Patent No.: US 10,325,956 B2
(45) Date of Patent: Jun. 18, 2019

(54) DEEP TRENCH ISOLATION SHRINKAGE METHOD FOR ENHANCED DEVICE PERFORMANCE

(71) Applicant: Taiwan Semiconductor Manufacturing Co., Ltd., Hsin-Chu (TW)

(72) Inventors: Cheng-Hsien Chou, Tainan (TW); Shih Pei Chou, Tainan (TW); Chih-Yu Lai, Tainan (TW); Sheng-Chau Chen, Tainan (TW); Chih-Ta Chen, Tainan (TW); Yeur-Luen Tu, Taichung (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/591,722

(22) Filed: May 10, 2017

(65) Prior Publication Data
US 2017/0243915 A1    Aug. 24, 2017

Related U.S. Application Data

(62) Division of application No. 14/314,193, filed on Jun. 25, 2014, now Pat. No. 9,653,507.

(51) Int. Cl.
*H01L 33/20*  (2010.01)
*H01L 27/146*  (2006.01)
*H01L 21/8238*  (2006.01)

(52) U.S. Cl.
CPC .......... *H01L 27/14685* (2013.01); *H01L 21/823878* (2013.01); *H01L 27/1462* (2013.01);
(Continued)

(58) Field of Classification Search
CPC ............... H01L 27/1463; H01L 21/823878
See application file for complete search history.

(56) References Cited

U.S. PATENT DOCUMENTS 4,685,198 A    8/1987    Kawakita et al.
4,845,048 A    7/1989    Tamaki et al.
(Continued)

FOREIGN PATENT DOCUMENTS

TW         400614 B    8/2000

OTHER PUBLICATIONS

Goushcha, et al. "Optical and Electrical Crosstalk in PIN Photodiode Array for Medical Imaging Applications." IEEE NSS2007 Paper M26-136. Nov. 5, 2007.
(Continued)

*Primary Examiner* — Farun Lu
(74) *Attorney, Agent, or Firm* — Eschweiler & Potashnik, LLC

(57) ABSTRACT

Some embodiments of the present disclosure relate to a method in which a functional layer is formed over an upper semiconductor surface of a semiconductor substrate, and a capping layer is formed over the functional layer. A first etchant is used to form a recess through the capping layer and through the functional layer. The recess has a first depth and exposes a portion of the semiconductor substrate there through. A protective layer is formed along a lower surface and inner sidewalls of the recess. A second etchant is used to remove the protective layer from the lower surface of the recess and to extend the recess below the upper semiconductor surface to a second depth to form a deep trench. To prevent etching of the functional layer, the protective layer remains in place along the inner sidewalls of the recess while the second etchant is used.

20 Claims, 8 Drawing Sheets

(52) U.S. Cl.
CPC .... *H01L 27/1463* (2013.01); *H01L 27/14687* (2013.01); *H01L 33/20* (2013.01)

(56) References Cited

U.S. PATENT DOCUMENTS

| | | | |
|---|---|---|---|
| 5,112,771 | A | 5/1992 | Ishii et al. |
| 5,262,002 | A | 11/1993 | Grewal et al. |
| 5,915,192 | A | 6/1999 | Liaw et al. |
| 6,140,208 | A | 10/2000 | Agahi et al. |
| 6,165,871 | A | 12/2000 | Lim et al. |
| 6,180,488 | B1 | 1/2001 | Kim et al. |
| 6,180,493 | B1 | 1/2001 | Chu |
| 6,214,696 | B1 | 4/2001 | Wu |
| 6,232,202 | B1 | 5/2001 | Hong |
| 6,313,008 | B1 | 11/2001 | Leung et al. |
| 6,350,657 | B1 | 2/2002 | Mastromatteo et al. |
| 6,723,618 | B2 | 4/2004 | Meyer et al. |
| 7,518,172 | B2 | 4/2009 | Moon et al. |
| 7,541,659 | B1 | 6/2009 | Nam et al. |
| 7,981,303 | B2 | 7/2011 | Bring et al. |
| 8,383,489 | B2 | 2/2013 | Huang |
| 2004/0237997 | A1* | 12/2004 | Rui ................ B08B 3/08 134/1.1 |
| 2006/0180885 | A1 | 8/2006 | Rhodes |
| 2008/0102557 | A1 | 5/2008 | Kim et al. |
| 2009/0230488 | A1 | 9/2009 | Ando |
| 2011/0025872 | A1* | 2/2011 | Oshiyama ......... H01L 27/14601 348/222.1 |
| 2012/0104539 | A1* | 5/2012 | Mehrotra ............ H01L 21/3083 257/506 |
| 2013/0102125 | A1 | 4/2013 | Venigalla et al. |
| 2014/0106163 | A1 | 4/2014 | Coue et al. |
| 2014/0110809 | A1* | 4/2014 | Kitamura ......... H01L 27/14623 257/435 |
| 2014/0357039 | A1 | 12/2014 | Liu et al. |
| 2015/0001669 | A1 | 1/2015 | Chou et al. |
| 2015/0091121 | A1 | 4/2015 | Manda et al. |
| 2016/0056197 | A1 | 2/2016 | Chen et al. |
| 2016/0112614 | A1 | 4/2016 | Masuda et al. |

OTHER PUBLICATIONS

Donohue, et al. "Recent Improvements in Deep Silicon Etching." Plasma Therm Inc. Aug. 26, 2004.
Non-Final Office Action dated May 19, 2016 for U.S. Appl. No. 14/314,193.
Final Office Action dated Sep. 27, 2016 for U.S. Appl. No. 14/314,193.
Notice of Allowance dated Jan. 11, 2017 for U.S. Appl. No. 14/314,193.

* cited by examiner

DEEP TRENCH ISOLATION SHRINKAGE METHOD FOR ENHANCED DEVICE PERFORMANCE

REFERENCE TO RELATED APPLICATION

This Application is a Divisional of U.S. application Ser. No. 14/314,193 filed on Jun. 25, 2014, the contents of which are hereby incorporated by reference in their entirety.

BACKGROUND

The present disclosure relates to deep trench isolation techniques, such as used in photovoltaic devices.

Photovoltaic devices are used in a wide variety of electronics applications ranging from image sensors, to optical detectors, to telecommunications, etc. Many photovoltaic devices utilize an array of pixels, which include photodiodes that convert an image into digital data. A photodiode consists of a p-n junction arranged between an anode and a cathode. When incident radiation from an image is absorbed near a depletion region of the p-n junction, an electron-hole pair is created. The electron is drawn to cathode and the hole is drawn to the anode to produce a photocurrent.

Some photodiodes are formed directly on a semiconductor substrate alongside an integrated circuit during a semiconductor manufacturing process. These photodiodes provide an advantage of lower power consumption, smaller size, faster data processing, and lower manufacturing cost than photodiodes formed external to the semiconductor substrate. The properties of a photodiode formed on a semiconductor substrate are determined from the bandgap of the semiconductor substrate, because the bandgap determines what wavelengths of incident light will excite electron-hole pairs to produce the photocurrent.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
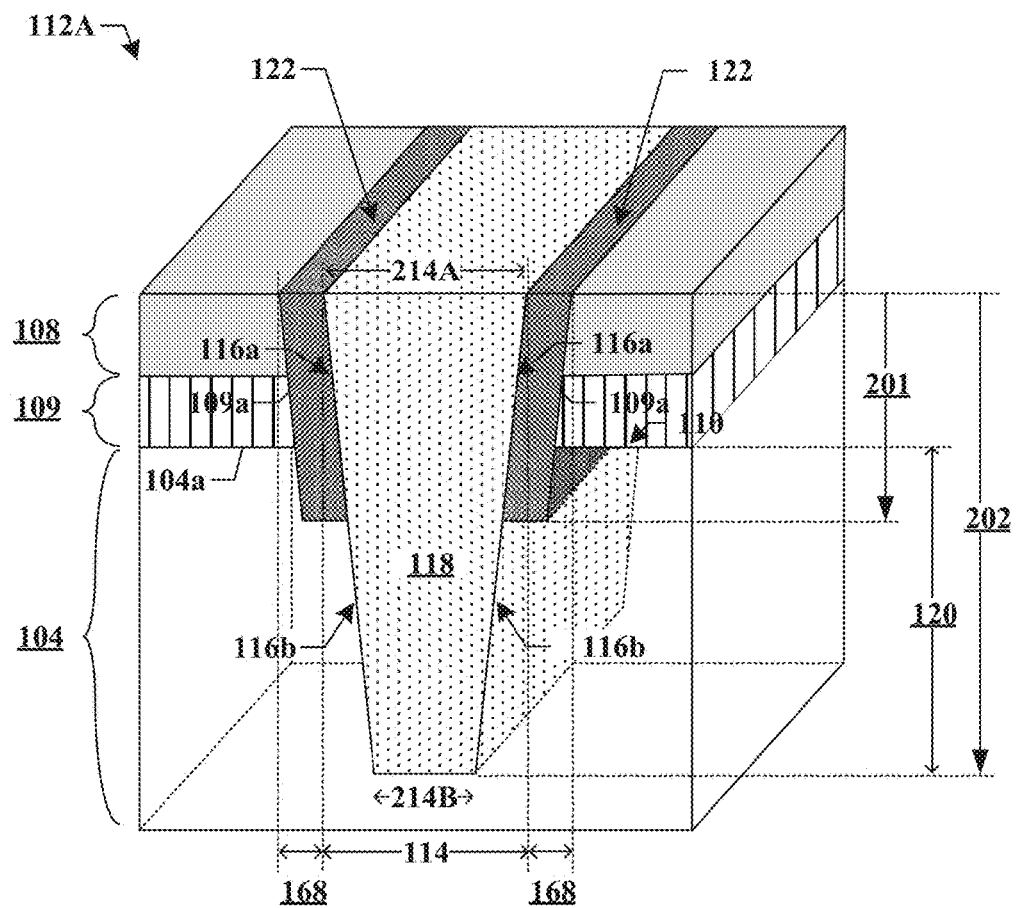
FIG. 1 illustrates a perspective view of a deep trench isolation (DTI) structure in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some semiconductor devices utilize deep trench isolation (DTI) structures to isolate neighboring active regions of a semiconductor substrate from one another. These DTI structures are formed by using an etch process to form a deep trench within the semiconductor substrate, which is then filled with a fill material. In some applications, a functional layer is disposed over an upper surface of the semiconductor substrate prior to etching the deep trench. The functional layer can enhance the performance of the semiconductor device, but also comprises one or more potential contaminants for the substrate. In some instances, the etch process used to form the deep trench dissociates these contaminants from the functional layer, and the dissociated contaminants then diffuse into the semiconductor substrate through sidewalls of the deep trench as the deep trench is being formed. These contaminants can degrade performance of the final semiconductor device, for example by lessening the isolation provided by the resultant DTI structure or by changing optical properties near an edge of the DTI structure.

Accordingly, some embodiments of the present disclosure relate to improved DTI structures, such DTI structure 112A as shown in FIG. 1. To mitigate contaminants from dissociating from a functional layer 109 into lower DTI sidewall regions 116b, the DTI structure 112A includes a protective capping layer 108 and a protective sleeve 122 arranged over a semiconductor substrate 104. During manufacturing, the capping layer 108 and protective sleeve 122 work cooperatively to limit dissociation of the functional layer 109 while the DTI structure 112A is formed. In particular, to form this DTI structure 112A, a first etch process forms a shallow trench which extends to depth 201. Because this first etch process etches away a portion of the functional layer 109 when forming this shallow trench, the first etch process can dissociate contaminants from the functional layer 109 as the functional layer 109 is being etched away. To limit the extent of any contaminants contaminating a deeper region of the DTI structure near lower DTI sidewalls 116b, the first etch stops shortly after the functional layer 109 has been fully removed from the shallow trench. The protective sleeve 122, typically in the form of a conformal protective liner, is then formed along upper DTI sidewalls 116a to cover exposed surfaces of the functional layer 109. While the protective sleeve 122 is in place, a second etch process, typically in the form of an anisotropic etch (e.g., unidirectional vertical etch), then extends the shallow trench from depth 201 to form a deep trench extending to depth 202. During this second etch process, the protective sleeve 122 remains in place to continuously cover the functional layer sidewalls 109a to prevent dissociation of contaminants from the functional layer 109. Therefore, unlike conventional DTI processes, the lower DTI sidewall regions 116b can be formed substantially free of contaminants arising from functional layer 109. A fill material 118, such as a continuous dielectric material or a dielectric liner with a tungsten core then fills the deep trench to form the final DTI structure 112A.

In some embodiments, DTI structure 112a has a deep trench width 114 in a range between about 0.05 and about 0.2 µm as measured between opposing deep trench sidewalls 116a. In some embodiments, the DTI structure 112A is arranged within a high-aspect-ratio deep trench having a first depth 120 greater than about 0.5 microns (µm) as measured from an upper substrate surface 104a. The deep trench can be tapered (i.e., narrows) along a direction 202, such that the width 114 has a maximum value 214A its top, and a minimum value 214B at its bottom. In some embodiments, the protective sleeve 122 has a sleeve width 168 in a range between about 0.001 µm and about 0.01 µm.

It will be appreciated that the protective sleeve 122 and corresponding manufacturing techniques, some examples of which are provided further below, can manifest themselves in a variety of different semiconductor device technologies. One particular technology where such a protective sleeve is advantageous is in the area of photovoltaic devices, as described below.

Figure 2A:
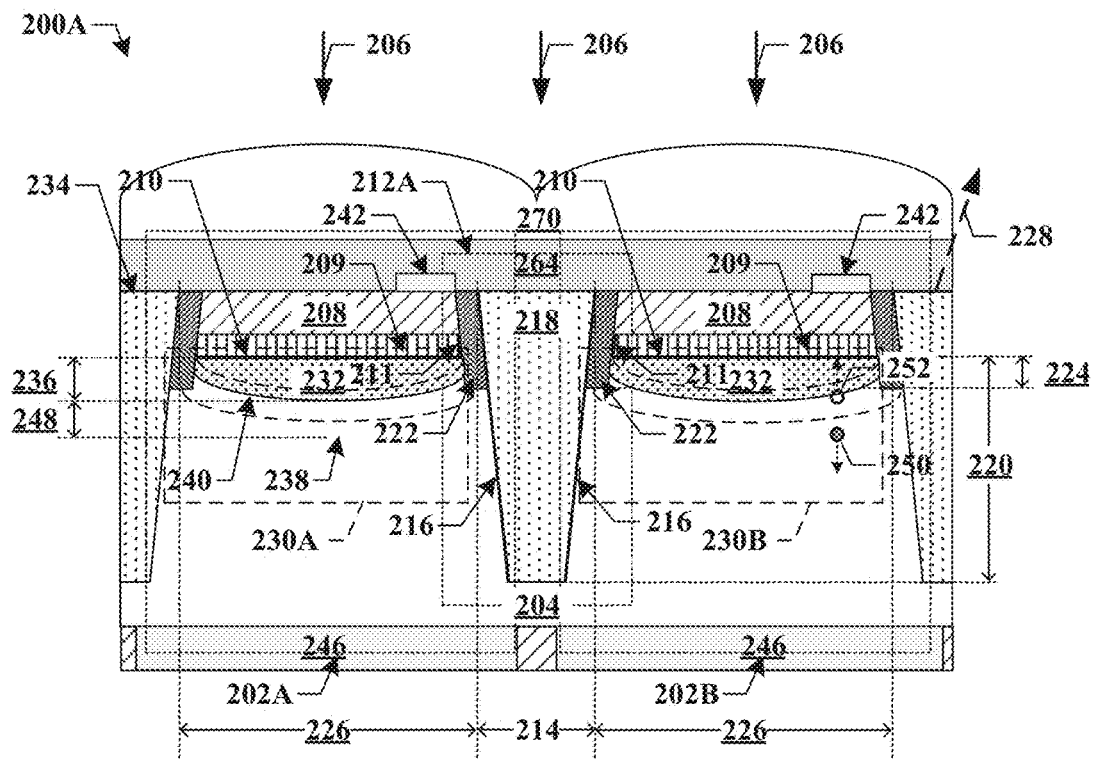
FIGS. 2A-2C illustrate cross-sectional views of photovoltaic devices in accordance with some embodiments.

FIG. 2A illustrates a cross-sectional view of a photovoltaic device 200A comprising first and second pixels 202A, 202B formed within a semiconductor substrate 204 (e.g., silicon, germanium, gallium arsenide, etc.), and separated by DTI structure 212A. The first and second pixels 202A, 202B include first and second photodiodes 230A, 230B, respectively, made up of a p-type region 232 formed within an n-type substrate region 204, such that a depletion region 238 is formed beneath an upper semiconductor surface 210 about opposite sides of p-n junction 240. During operation of photovoltaic device 200A, when incident radiation 206 of sufficient energy strikes the first or second photodiode 230A, 230B, it creates an electron-hole pair (i.e., electron 250 and hole 252). The hole 252 is accelerated toward anode 242, and the electron 250 is accelerated toward cathode 246 to produce a photocurrent. A color filter layer 264 is optionally disposed over an upper capping surface 234 of first and second pixels 202A, 202B, and a micro-lens 270 is optionally disposed over the color filter layer 264 in some embodiments.

The first and second pixels 202A, 202B include a functional layer 209 disposed over an upper semiconductor surface 210 of the semiconductor substrate 204, and a capping layer 208, such as an oxide (e.g., $SiO_2$) disposed over the functional layer 209. In some embodiments, the functional layer 209 comprises an antireflective coating, such as hafnium oxide ($HfO_2$) or an oxide and $HfO_2$ heterostructure ($Ox/HfO_2$) for example, to increase the amount of incident radiation 206 absorbed by the first and second pixels 202A, 202B.

The first DTI structure 212A comprises a fill material 218 (e.g., oxide, tungsten) disposed within a deep trench. The deep trench has a deep trench width 214 as measured between opposing deep trench sidewalls 216. The first DTI structure 212A is formed though the capping layer 208 and the functional layer 209, and extends beneath the upper semiconductor surface 210 to a first depth 220. A protective sleeve 222 (e.g., silicon oxide ($SiO_2$), silicon nitride (SiN)) is arranged partially along the sidewalls 216 of the deep trench (or equivalently, the first DTI structure 212A), between the fill material and 218 the functional layer 209. The protective sleeve 222 extends along the sidewalls 216 beneath the upper semiconductor surface 210 to a second depth 224, which is less than the first depth 220.

The protective sleeve 222 is configured to prevent etching of the functional layer 209, which prevents contaminants from the functional layer 209 from diffusing into the first and second pixels 202A, 202B through the sidewalls 216 of the deep trench during formation of the first DTI structure 212A, during the deep trench etch. To form the protective sleeve 222, a first etch process forms a recess within the protective and functional layers 208, 209, which extends to the second depth 224 below the upper semiconductor surface 210. The protective sleeve 222 is then formed along sidewalls 216 of the recess, and covers exposed surfaces 211 of the functional layer 209. After formation of the protective sleeve 222, a second etch process then extends the recess to form a deep trench with the first depth 220, while the protective sleeve 222 prevents contaminants from the functional layer 209 from penetrating the first or second pixel 202A, 202B through the sidewalls 216 of the deep trench.

For the embodiments of FIG. 2A, the protective sleeve 222 is illustrated as extending below the upper semiconductor surface 210 to ensure that the exposed surfaces 211 of the functional layer 209 are fully covered with some additional overlap margin of the protective sleeve 222 past the exposed surfaces 211. In some embodiments, however, the second depth 224 can be essentially zero (i.e., no additional overlap margin). The protective sleeve 222 has a lower edge that remains spaced apart from the bottommost surface of the deep trench. This spacing is present because the lower deep trench portion extending below the protective sleeve 222 (i.e., the first depth 220 minus the second depth 224) is formed by the second etch process, which occurs after formation of the protective sleeve 222.

As will be appreciated in more detail further herein (e.g., in the description of embodiments of FIGS. 3A-3F), the protective sleeve 222 also reduces the deep trench width 214 from an optical opacity standpoint. Adjacent pixels of the array can experience electrical crosstalk due to the diffusion of carriers (i.e., electrons or holes), created by the incident radiation 206 from an illuminated pixel to a neighboring pixel. Adjacent pixels can also experience optical crosstalk due to scattering of the incident radiation 206 from the illuminated pixel to the neighboring pixel. In order to mitigate against optical crosstalk, the fill material 218 is opaque to the incident radiation 206, and therefore absorbs or reflects the incident radiation 206. Consequently, the first DTI structure 212A in some regards reduces the amount of surface area on the semiconductor substrate 204 that can absorb the incident radiation 206. Therefore, in embodiments where the protective sleeve 222 is optically transparent, the presence of the protective sleeve 222 can reduce optical opacity over the deep trench width 214 and increases an effective width 226 of the first and second pixels 202A, 202B. This can increase the amount of incident radiation that can be absorbed by the photovoltaic device 200A, and consequently increases its quantum efficiency (QE).

Figure 2B:
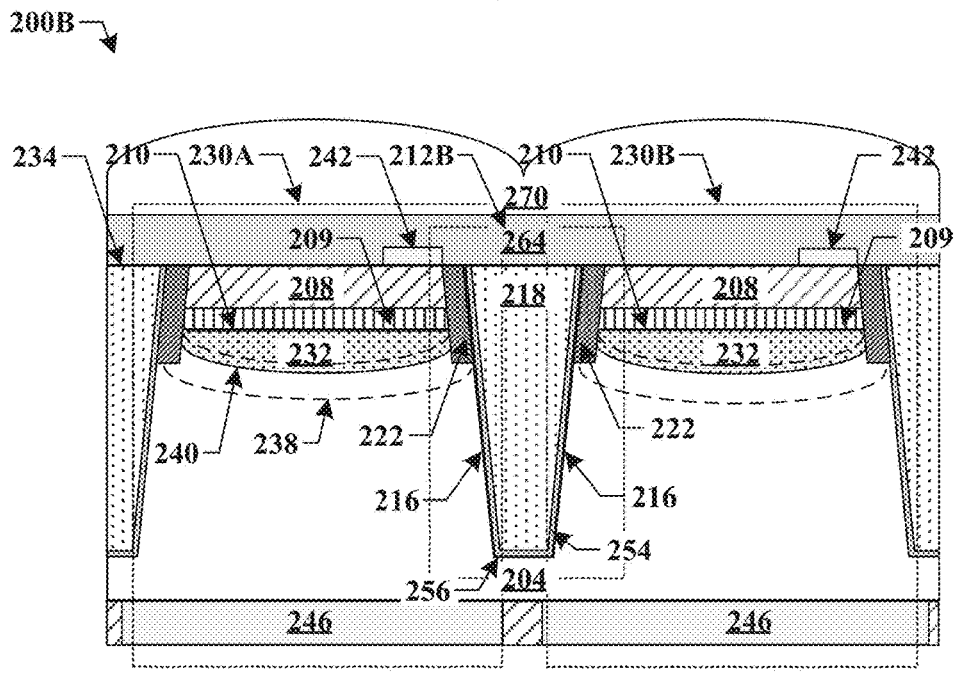

FIG. 2B illustrates a cross-sectional view of a photovoltaic device 200B, which is similar in many respects to FIG. 2A but which includes a dielectric liner 254 configured to trap charge and reduce dark current. Dark current is a condition that can degrade image quality and occurs when the photovoltaic device produces current even when light is not impingent on the photodiodes. To mitigate dark current, the dielectric liner 254 is disposed along a lower surface 256 and the sidewalls 216 of the deep trench prior to introducing the fill material 118. The dielectric liner 254 consequently separates the fill material 218 from the semiconductor substrate 204. In some embodiments, the dielectric liner 254 comprises $HfO_2$ and/or oxide (e.g., $SiO_2$). In some embodiments, the dielectric liner 254 comprises $HfO_2$ doped with aluminum (Al), tantalum (Ta), cobalt (Co), germanium (Ge), or other appropriate dopant.

Figure 2C:
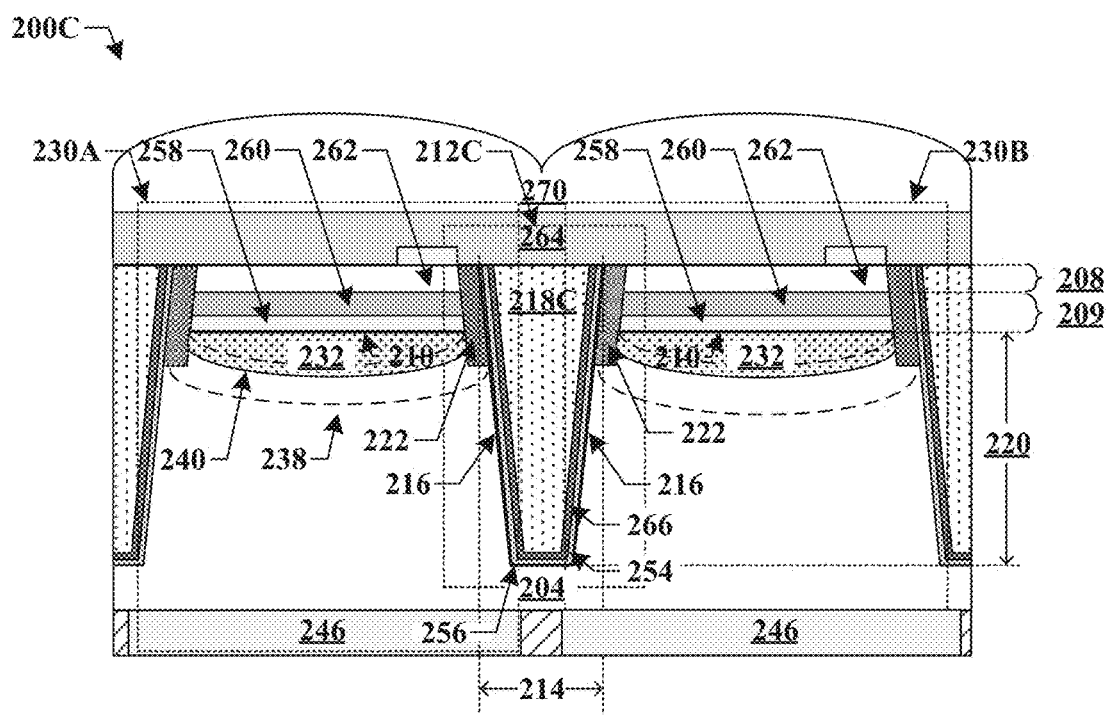

FIG. 2C illustrates a cross-sectional view of a photovoltaic device 200C comprising first and second photodiodes 230A, 230B that are separated by a third DTI structure 212C. The third DTI structure 212C includes a dielectric liner 254 to provide electrical isolation and/or charge trapping, as well as a tungsten body 218C filling a core region of the deep trench. In instances where the deep trench is a high-aspect-ratio deep trench, the deep trench may be problematic to fill with some conventional fill techniques and fill materials such as oxide. As such, the third DTI structure 212C uses tungsten (W) as the fill material 218C. Tungsten has an advantage over some conventional fill materials because its good fill-properties ease filling of the high-aspect-ratio trench, and because it can help prevent electric and optical crosstalk between the first and second photodiodes 230A, 230B. When tungsten is used as fill material 218C, a seed layer 266 comprising titanium nitride (TiN) is disposed over the dielectric liner 254 on the lower surface 156 and the sidewalls 216 of the deep trench. The seed layer 266 promotes tungsten deposition within the high-aspect-ratio deep trench.

Additionally, FIG. 2C shows an example where an anti-reflective layer 258, passivation layer 260, and capping layer are each disposed over the substrate 204. This configuration can also be used in other embodiments, although it was not illustrated for purposes of conciseness. In some embodiments of FIG. 2C, the anti-reflective layer 258 comprises hafnium oxide ($HfO_2$), or an oxide and $HfO_2$ heterostructure (Ox/$HfO_2$), configured to prevent reflection of incident radiation. In some embodiments, the passivation layer 260 comprises silicon nitride (SiN), silicon dioxide ($SiO_2$), titanium dioxide ($TiO_2$), or tantalum oxide ($Ta_2O_5$) configured to reduce electron-hole recombination near the upper semiconductor surface 210. The capping layer 262 can comprise an oxide, such as $SiO_2$, or a nitride, such as SiN, for example.

Figure 3A:
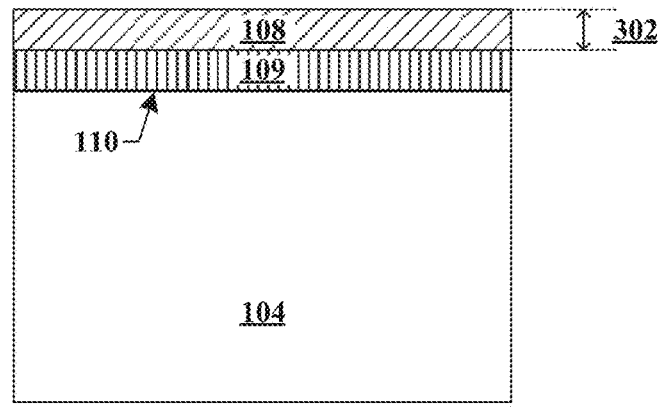
FIGS. 3A-3F illustrate a series of cross-sectional views that collectively depict forming a DTI structure in accordance with some embodiments.

FIGS. 3A-3F illustrates a series of cross-sectional views that collectively depict forming the DTI structure 112A. It is appreciated that formation of the other DTI structures of FIGS. 2A-2C follows by analogy. FIG. 3A illustrates a cross-sectional view a photovoltaic device 300 comprising a functional layer 109 disposed over an upper semiconductor surface 110 of a semiconductor substrate 104, and a capping layer 108 disposed over the functional layer 109. In some embodiments, the capping layer 108 comprises an oxide layer (e.g., $SiO_2$) with an oxide thickness 302 sufficient to withstand a CMP step (e.g., See FIG. 3F). In some embodiments, the oxide thickness 302 is in a range of about 1 μm to about 5 μm. In some embodiments, the functional layer 109 comprises $HfO_2$ configured as an anti-reflective coating. In some embodiments, the functional layer 109 further comprises $Ta_2O_5$ configured to passivate the upper semiconductor surface 110.

Figure 3B:
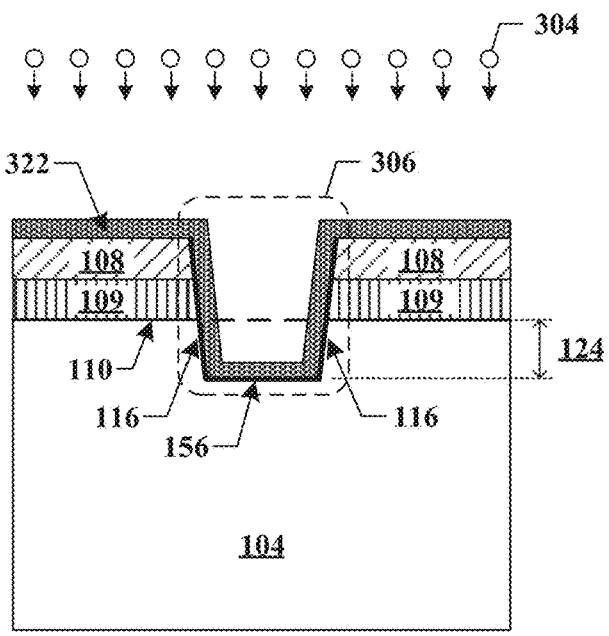

In FIG. 3B, an upper capping surface of the capping layer 108 is exposed to a first etchant 304 that forms a recess 306 within the capping and functional layers 108, 109. This recess 306 extends beneath the upper semiconductor surface 110 to a second depth 124. In some embodiments, the second depth 124 is zero such that a bottom surface of the recess 306 coincides with the upper semiconductor surface 110. In some embodiments, the first etchant 304 comprises a fluorine ($F_2$) based gas to insure a high-aspect-ratio for the recess 306. Various other wet and dry etchants may be used, including, but not limited to, chlorine ($Cl_2$) or hydrogen bromide (HBr). After formation of the recess, a protective layer 322 is disposed along a lower surface 156 and sidewalls 116 of the recess 306. In some embodiments, the protective layer 322 comprises oxide (e.g., $SiO_2$). In some embodiments, the protective layer 322 comprises nitride (e.g., SiN). In some embodiments, the protective layer 322 comprises a thickness in a range of about 0.001 μm to about 0.01 μm.

Figure 3C:
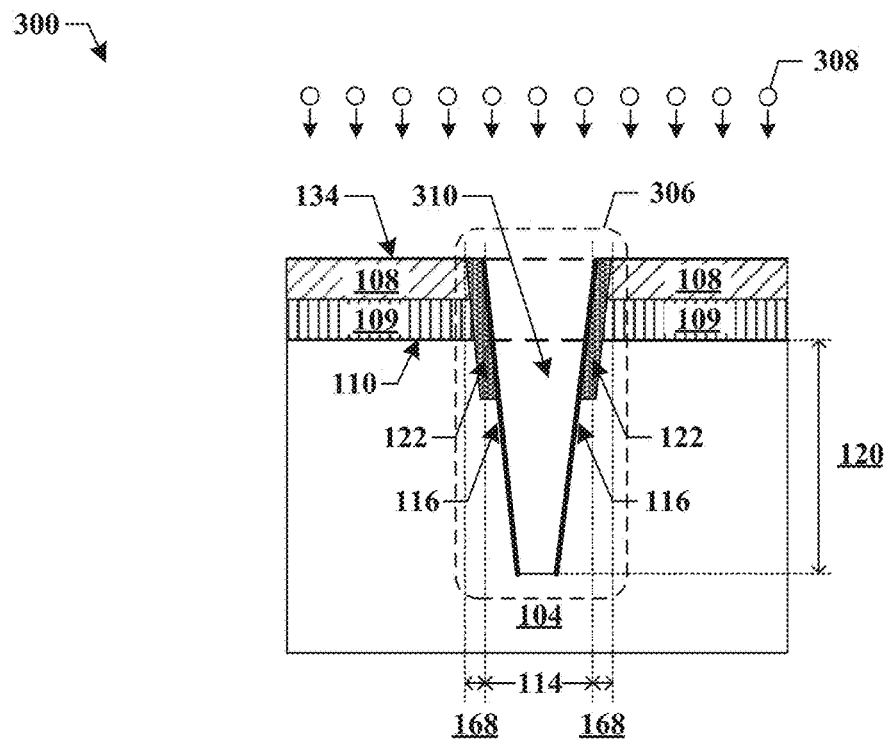

In FIG. 3C, the structure is exposed to a second etchant 308 that further extends the recess 306 below the upper semiconductor surface 110 to a second depth 120, to form a deep trench 310. The second etchant 308 etches away portions of the protective layer 322 disposed along a lower surface 156 of the recess 306, while leaving portions of the protective layer 322 disposed on the sidewalls 116 substantially intact to form a protective sleeve 122. This protective sleeve 122 protects the sidewalls 116 and prevents etching of the functional layer 109 by the second etchant 308. The protective sleeve 122 also reduces the deep trench width 114 of the recess 306 prior to exposing the semiconductor substrate 104 to the second etchant 308, such that the deep trench 310 has a deep trench width 114 as measured between inside edges of the protective sleeve 122.

In some embodiments, the second etchant 308 comprises a fluorine ($F_2$) based gas to ensure a high-aspect-ratio for the deep trench. It is appreciated that fluorine-based etch chemistries are utilized to achieve high-aspect-ratio trenches within a silicon (Si) substrate due to their high efficiency free radical disassociation and resulting high etch rates. However, the fluorine based etch is essentially an isotropic process. Consequently, the protective layer 322 helps to achieve anisotropy while etching with the second etchant, to maintain a high-aspect-ratio deep trench 310.

Figure 3D:
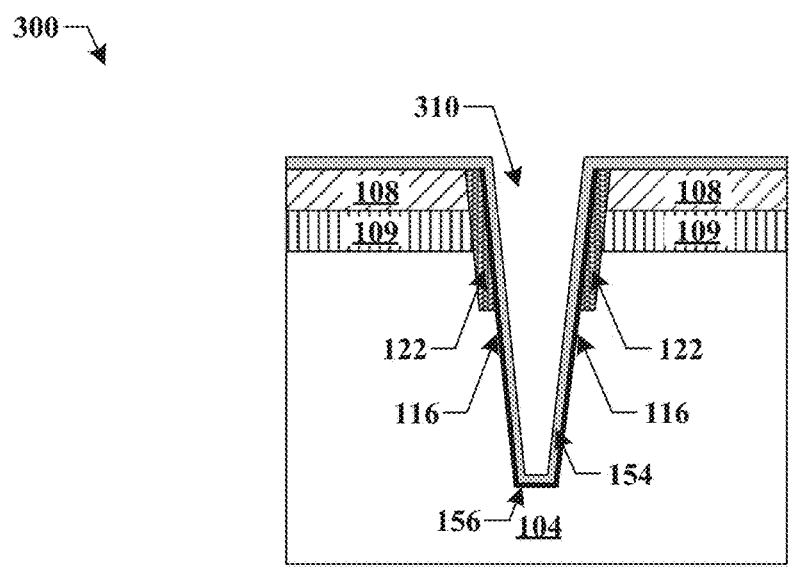

In FIG. 3D, a dielectric liner 154 is disposed along the upper capping surface 134, sidewalls 116, and lower surface 156 of the deep trench 310. In some embodiments, the dielectric liner 154 comprises $HfO_2$ configured to act as a charge-trapping layer to minimize dark current within the photovoltaic device 300. In some embodiments, the dielectric liner 154 comprises a thickness in a range of about 0.01 μm to about 0.1 μm. In some embodiments, disposal of the dielectric liner 154 comprises a low temperature oxidation process.

Figure 3E:
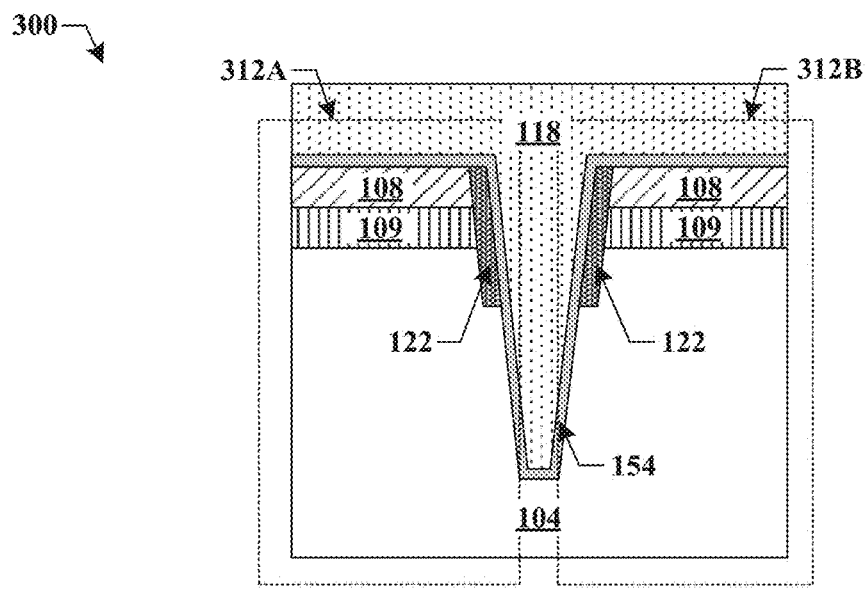

In FIG. 3E, the deep trench 310 is filled with a fill material 118 (e.g., oxide, tungsten) to form a boundary between a pair of photosensitive pixels 312A, 312B formed within the semiconductor substrate 104.

Figure 3F:
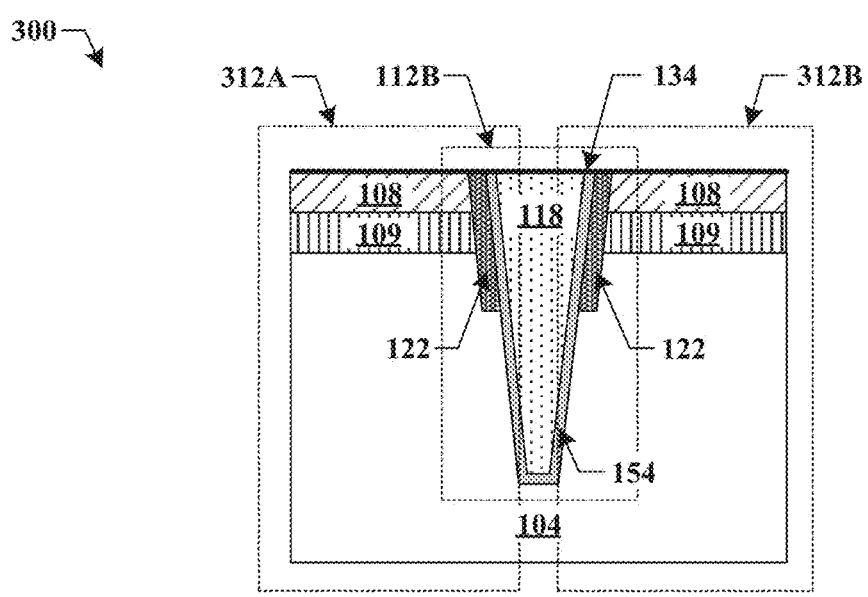

In FIG. 3F, the upper capping surface 134 is subjected to a planarization process (i.e., a CMP) to remove excess fill material 118, resulting in the DTI structure.

Figure 4:
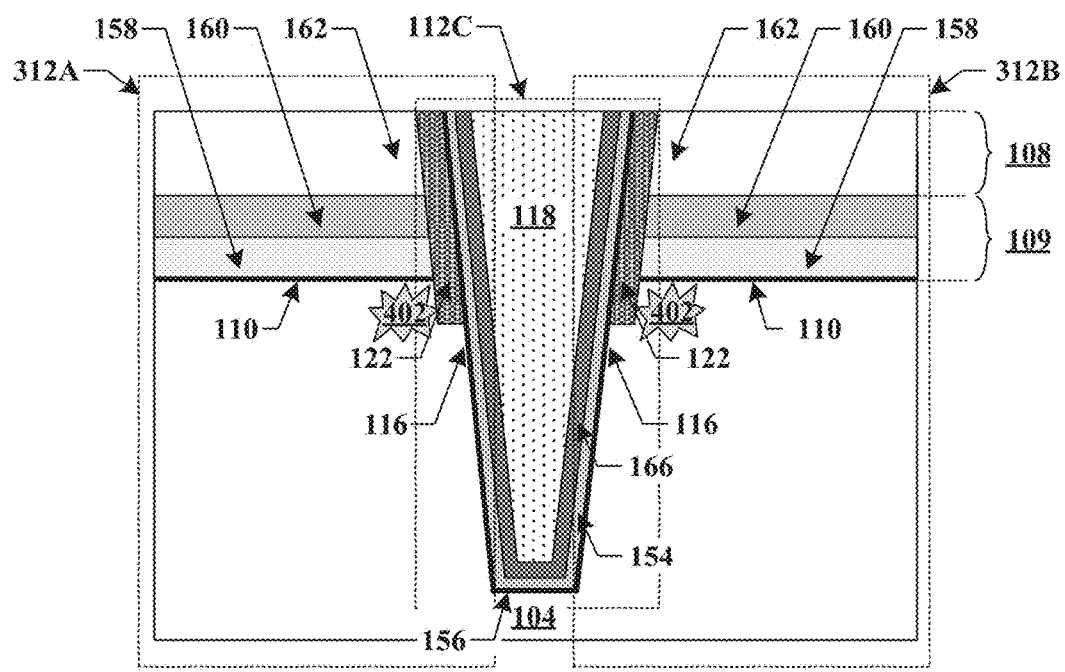
FIG. 4 illustrates a cross-sectional view of a DTI structure in accordance with some embodiments.

FIG. 4 illustrates a cross-sectional view a photovoltaic device 400 comprising a functional layer 109 disposed on an upper semiconductor surface 110 of a semiconductor substrate 104, and a capping layer 108 disposed over the functional layer 109. The functional layer 109 is formed by sequentially disposing an anti-reflective layer 158 (e.g., $HfO_2$) over the upper semiconductor surface 110 and disposing a passivation layer 160 (e.g., $Ta_2O_5$) over the anti-reflective layer 158. The capping layer 108 is formed by disposing an oxide layer 162 (e.g., $SiO_2$) over the functional layer 109.

During formation of this device, the first etchant 304 etches the $HfO_2$ and $Ta_2O_5$ within the functional layer 109 to form contaminants 402 comprising tantalum (Ta) or hafnium (Hf), which can diffuse into the semiconductor substrate 104 through upper sidewalls 116 of the deep trench during the first etch. Therefore, a wet clean is performed prior to exposing the semiconductor substrate 104 to the second etchant 308 to remove the contaminants 402 from within the upper portion of the recess. The protective sleeve 122 is formed after the wet clean, and prevents further etching of the functional layer 109 by the second etchant 308.

After the protective sleeve is formed, a second etch is carried out to deepen the trench. The dielectric liner 154 (e.g., $HfO_2$) is then formed along the lower surface 156 and the sidewalls 116 of the deep trench, and a seed layer 166 (e.g., TiN) is disposed over the dielectric liner 154. Tungsten is then used to fill the remainder of the deep trench.

Figure 5:
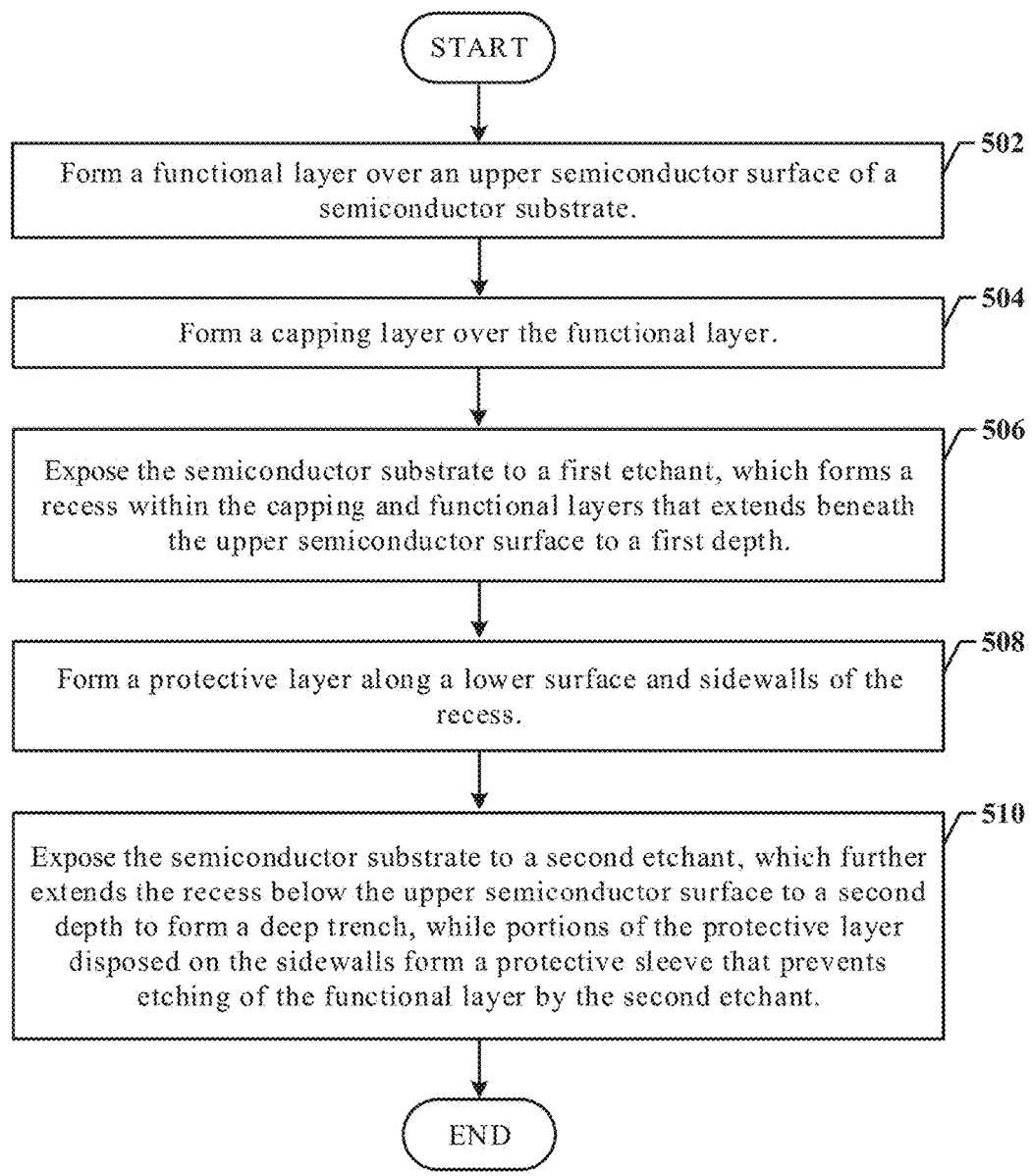
FIG. 5 illustrates a method of forming a DTI structure in accordance with some embodiments.

FIG. 5 illustrates a method 500 of forming a DTI structure in accordance with some embodiments.

At 502 a functional layer is formed over an upper semiconductor surface of a semiconductor substrate. In some embodiments, the functional layer comprises a $Ta_2O_5$ passivation layer. In some embodiments, the functional layer comprises an $Ox/HfO_2$ anti-reflective layer.

At 504 a capping layer is formed over the functional layer. In some embodiments, the capping layer comprises oxide configured to withstand a planarization step (e.g., a CMP), after formation of the DTI structure.

At 506 the upper semiconductor surface is exposed to a first etchant, which forms a recess within the capping and functional layers that extends beneath the upper semiconductor surface to a first depth. In various embodiments, the first etchant comprises a fluorine ($F_2$), chlorine ($Cl_2$), or hydrogen bromide (HBr) based etch chemistry.

At 508 a protective layer is formed along a lower surface and sidewalls of the recess. The protective layer is configured to shield exposed sidewalls of the functional layer during subsequent etch steps. In various embodiments, the protective layer comprises oxide (e.g., $SiO_2$), nitride (e.g., SiN), or a combination thereof. In some embodiments, the protective layer comprises a thickness in a range of about 0.001 µm to about 0.01 µm.

At 510 the semiconductor substrate is exposed to a second etchant, which further extends the recess below the upper semiconductor surface to a second depth to form a deep trench. In various embodiments, the second etchant comprises a fluorine ($F_2$) based etch chemistry configured to achieve a high-aspect-ratio etch profile. The second etchant removes portions of the protective layer disposed on a lower surface of the recess, while portions disposed on the sidewalls of the recess remain intact to form a protective sleeve that prevents etching of the functional layer. The protective sleeve prevents contaminant egression from the functional layer resulting from exposure to the second etchant, which reduces white pixel (WP) effects. The protective sleeve also reduces the recess width prior to exposing the semiconductor substrate to the second etchant, such that the deep trench is narrowed by the protective sleeve to have a deep trench width as measured between edges of the protective layer. The reduction in the deep trench width increases the amount of incident radiation absorbed by the semiconductor substrate, which consequently increases the quantum efficiency (QE) of a photovoltaic device formed within the semiconductor substrate.

Therefore, some embodiments of the present disclosure relate to a deep trench isolation (DTI) structure configured to enhance efficiency and performance of a photovoltaic device. The photovoltaic device comprises a functional layer disposed over an upper surface of a semiconductor substrate, and a pair of pixels formed within the semiconductor substrate, which are separated by the DTI structure. The DTI structure is arranged within a deep trench. Sidewalls of the deep trench are partially covered with a protective sleeve formed along the functional layer prior to etching the deep trench. The protective sleeve prevents etching of the functional layer while etching the deep trench, which prevents contaminants from penetrating the pair of pixels. The protective sleeve also narrows the width of the DTI structure, which increases pixel area and subsequently the efficiency and performance of the photovoltaic device.

Some embodiments relate to a deep trench isolation (DTI) structure, comprising a semiconductor substrate having an upper semiconductor surface. A functional layer is disposed over the upper semiconductor surface, and a capping layer is disposed over the functional layer. A deep trench, which has a deep trench width as measured between opposing deep trench sidewalls, is formed through the capping and functional layers, and extending beneath the upper semiconductor surface to a first depth. A fill material fills the deep trench, and a protective sleeve arranged partially along the sidewalls of the deep trench between the fill material and the functional layer.

Other embodiments relate to a photovoltaic device, comprising a semiconductor substrate having an upper semiconductor surface. A functional layer is disposed over the upper semiconductor surface, and a capping layer is disposed over the functional layer. A pair of pixels are formed within the semiconductor substrate, and configured to produce a current by absorbing incident radiation. A deep trench, which has a deep trench width as measured between opposing deep trench sidewalls, and is configured to isolate the pair of pixels from one-another, is formed though the capping layer and extending beneath the upper semiconductor surface to a first depth. A fill material fills the deep trench, and a protective sleeve arranged partially along the sidewalls of the deep trench between the fill material and the functional layer.

Still other embodiments relate to a method of forming a photovoltaic device, comprising forming a functional layer over an upper semiconductor surface of a semiconductor substrate. The method further comprises using a first etchant to form a recess within the functional layer, wherein the recess has a first depth and exposes a portion of the semiconductor substrate there through. The method further comprises forming a protective layer along a lower surface and sidewalls of the recess. The method further comprises using a second etchant to extend the recess below the upper semiconductor surface to a second depth to form a deep trench, while the protective layer disposed on the sidewalls prevents etching of the functional layer.

While method 500 has been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a functional layer over an upper semiconductor surface of a semiconductor substrate;
    forming a capping layer over the functional layer;
    using a first etchant to form a recess through the capping layer and through the functional layer, wherein the recess has a first depth and exposes a portion of the semiconductor substrate there through;
    forming a protective layer along a lower surface and inner sidewalls of the recess;
    using a second etchant to remove the protective layer from the lower surface of the recess and to extend the recess below the upper semiconductor surface to a second depth to form a deep trench, wherein, to prevent etching of the functional layer, the protective layer remains in place along the inner sidewalls of the recess while the second etchant is used; and
    forming a dielectric liner along a lower surface of the deep trench, inner sidewalls of the deep trench, and inner sidewalls of the protective layer to partially fill the deep trench while leaving a remainder of the deep trench unfilled.

2. The method of claim 1, wherein the capping layer remains in place on an upper surface of the functional layer while the second etchant is used, such that the protective layer and capping layer each come into contact with the second etchant and cooperatively prevent etching of the functional layer while the second etchant is used.

3. The method of claim 1, wherein the protective layer extends along the inner sidewalls of the recess beneath the upper semiconductor surface to the first depth, and the dielectric liner extends along the inner sidewalls of the deep trench to a second depth which is greater than the first depth.

4. The method of claim 1, further comprising:
    after the forming of the dielectric liner, filling the remainder of the deep trench with a fill material to form a boundary between a pair of photosensitive pixels formed within the semiconductor substrate.

5. The method of claim 1, wherein forming the functional layer comprises:
    forming an anti-reflective layer over the upper semiconductor surface of the semiconductor substrate; and
    forming a passivation layer over the anti-reflecting layer, such that the anti-reflective layer separates the passivation layer from the upper surface of the semiconductor substrate.

6. The method of claim 5, wherein:
    the anti-reflective layer comprises hafnium oxide ($HfO_2$);
    the passivation layer comprises tantalum oxide ($Ta_2O_5$);
    the first etchant etches the anti-reflective layer and the passivation layer to form contaminants comprising tantalum (Ta) or hafnium (Hf) within the semiconductor substrate; and
    a wet clean is performed prior to exposing the semiconductor substrate to the second etchant to remove the contaminants from within the recess.

7. The method of claim 1, further comprising:
    forming a mask over the capping layer prior to using the first etchant, the mask including openings that leave portions of the capping layer exposed; and
    wherein use of the first etchant removes the exposed portions of the capping layer and underlying portions of the functional layer to form the recess.

8. A method, comprising:
    forming a functional layer over an upper semiconductor surface of a semiconductor substrate;
    forming a capping layer over the functional layer;
    using a first etchant to form a recess through the capping layer and through the functional layer, wherein the recess has a first depth and exposes a portion of the semiconductor substrate there through;
    forming a protective layer along a lower surface and inner sidewalls of the recess;
    using a second etchant to remove the protective layer from the lower surface of the recess and to extend the recess below the upper semiconductor surface to a second depth to form a deep trench, wherein, to prevent etching of the functional layer, the protective layer remains in place along the inner sidewalls of the recess while the second etchant is used; and
    forming a continuous dielectric liner over the capping layer and along inner sidewalls of the protective layer while leaving a remainder of the deep trench unfilled.

9. The method of claim 8, further comprising:
    filling the remainder of the deep trench with a fill material; and
    planarizing the fill material and continuous dielectric liner, wherein after planarizing, an upper surface of the fill material, an upper surface of the continuous dielectric liner, an upper surface of the capping layer, and an upper surface of the protective layer are coplanar.

10. The method of claim 8, wherein a bottom surface of the protective layer is coplanar with a bottom surface of the functional layer.

11. The method of claim 8, further comprising:
    performing a wet cleaning after the using of the first etchant and before the using of the second etchant to remove contaminants from the functional layer as a result of the using of the first etchant.

12. The method of claim 8, wherein the capping layer remains in place on an upper surface of the functional layer while the second etchant is used, such that the protective layer and the capping layer each come into contact with the second etchant and cooperatively prevent etching of the functional layer while the second etchant is used.

13. The method of claim 8, wherein forming the functional layer comprises:
    forming an anti-reflective layer over the upper semiconductor surface of the semiconductor substrate; and
    forming a passivation layer over the anti-reflecting layer, such that the anti-reflective layer separates the passivation layer from the upper surface of the semiconductor substrate.

14. A method, comprising:
    forming a functional layer over an upper semiconductor surface of a semiconductor substrate;
    forming a capping layer over the functional layer;
    performing a first etch to form a recess through the capping layer and through the functional layer, wherein the recess has a first depth and exposes a portion of the semiconductor substrate there through;

forming a protective layer along a lower surface and inner sidewalls of the recess; and performing a single, second etch to remove the protective layer from the lower surface of the recess and to extend the recess below the upper semiconductor surface to a second depth to form a deep trench, wherein, to prevent etching of the functional layer, the protective layer remains substantially intact along the inner sidewalls of the recess while the single, second etch is performed.

15. The method of claim 14, further comprising:

forming a dielectric liner continuously along a lower surface of the deep trench, inner sidewalls of the deep trench, and inner sidewalls of the protective layer to partially fill the deep trench while leaving a remainder of the deep trench unfilled.

16. The method of claim 14, wherein an inner sidewall that connects a lower surface of the deep trench to a top surface of the deep trench is coplanar.

17. The method of claim 14, wherein the second depth is greater than the first depth, and wherein a bottom surface of the recess at the first depth is coplanar with a bottom surface of the functional layer and the upper surface of the semiconductor substrate.

18. The method of claim 14, further comprising:

forming a mask over the capping layer prior to performing the first etch, the mask including openings that leave portions of the capping layer exposed; and wherein performing of the first etch removes the exposed portions of the capping layer and underlying portions of the functional layer to form the recess.

19. The method of claim 15, further comprising:

filling the remainder of the deep trench with a fill material, wherein a dielectric liner separates the fill material from the semiconductor substrate.

20. The method of claim 19, further comprising:

performing a planarization process, wherein after the planarization process, an upper surface of the fill material, an upper surface of the dielectric liner, an upper surface of the capping layer, and an upper surface of the protective layer are coplanar.

* * * * *